United States Patent
Kang et al.

(10) Patent No.: US 6,919,278 B2
(45) Date of Patent: Jul. 19, 2005

(54) METHOD FOR ETCHING SILICON CARBIDE

(75) Inventors: Sean S. Kang, Fremont, CA (US); Si Yi Li, Milpitas, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 214 days.

(21) Appl. No.: 10/199,190

(22) Filed: Jul. 19, 2002

(65) Prior Publication Data

US 2003/0087531 A1 May 8, 2003

Related U.S. Application Data

(63) Continuation-in-part of application No. 09/820,696, filed on Mar. 30, 2001, now abandoned.

(51) Int. Cl.[7] ........................ H01L 21/311; H01L 21/461
(52) U.S. Cl. ........................ 438/706; 438/714; 438/719
(58) Field of Search ........................ 438/706, 714, 438/719

(56) References Cited

U.S. PATENT DOCUMENTS

| | | | |
|---|---|---|---|
| 3,398,033 A | 8/1968 | Haga et al. | |
| 4,351,894 A | 9/1982 | Yonezawa et al. | |
| 4,595,453 A | 6/1986 | Yamazaki et al. | |

FOREIGN PATENT DOCUMENTS

| | | |
|---|---|---|
| DE | 4310345 A1 | 10/1994 |
| EP | 0600664 A2 | 6/1994 |
| EP | 0926715 A2 | 6/1999 |
| JP | 63-152125 | 6/1998 |
| JP | 2001102447 A | 4/2001 |
| WO | WO 9952135 A | 10/1999 |

OTHER PUBLICATIONS

Lo, T.C. et al., "Reactive ion etching of a–SiC :H films using $CCl_4$ and $O_2$ gas mixture", Journal of Vacuum Science and Technology: Part A, American Institute of Physics., New York, US, vol. 11, No. 2, Mar. 1, 1993.

PCT International Search Report, PCT/US02/21863 dated Jan. 29, 2003.

Moalem et al., "Low–temperature vapor–phase etching of silicon carbide by dioxygen difluoride", Applied Phys. Lett., 1995, pp. 3480–3482, vol. 66(25), American Institute of Physics, New York, USA.

U.S. Appl. No. 10/430,013, filed May 6, 2003, Inventor Si Yi Li.

*Primary Examiner*—Duy-Vu N. Deo
(74) *Attorney, Agent, or Firm*—IP Strategy Group, P.C.

(57) ABSTRACT

A system and method for achieving a silicon carbide to low-k dielectric etch selectivity ratio of greater than 1:1 using a chlorine containing gas and either hydrogen ($H_2$) gas or nitrogen ($N_2$) gas is described. The method is applied to a semiconductor substrate having a low-k dielectric layer and a silicon carbide layer. The chlorine containing gas is a gas mixture that includes either HCl, $BCl_3$, $Cl_2$, or any combination thereof. In one embodiment, the method provides for supplying an etchant gas comprising a chlorine containing gas and a hydrogen ($H_2$) gas. The etchant gas is then energized to generate a plasma which then etches openings in the silicon carbide at a faster etch rate than the low-k dielectric etch rate. In an alternative embodiment, the etchant gas mixture comprises a chlorine containing gas and a nitrogen ($N_2$) gas.

19 Claims, 4 Drawing Sheets

U.S. PATENT DOCUMENTS

| | | | |
|---|---|---|---|
| 4,735,920 A | 4/1988 | Stephanie et al. | |
| 4,865,685 A | 9/1989 | Palmour et al. | |
| 4,981,551 A | 1/1991 | Palmour et al. | |
| 5,254,215 A | 10/1993 | Terakado et al. | |
| 5,356,478 A | 10/1994 | Chen et al. | |
| 5,626,775 A * | 5/1997 | Roberts et al. | 216/67 |
| 5,647,953 A | 7/1997 | Williams et al. | |
| 5,681,424 A | 10/1997 | Saito et al. | |
| 5,756,400 A * | 5/1998 | Ye et al. | 438/710 |
| 5,770,523 A | 6/1998 | Hung et al. | |
| 5,817,578 A | 10/1998 | Ogawa | |
| 5,820,723 A | 10/1998 | Benjamin et al. | |
| 5,928,967 A | 7/1999 | Radens et al. | |
| 5,981,551 A * | 11/1999 | Luengo et al. | 514/333 |
| 6,040,248 A | 3/2000 | Chen et al. | |
| 6,074,514 A | 6/2000 | Bjorkman et al. | |
| 6,090,304 A | 7/2000 | Zhu et al. | |
| 6,103,590 A | 8/2000 | Swanson et al. | |
| 6,136,211 A | 10/2000 | Qian et al. | |
| 6,153,935 A | 11/2000 | Edelstein et al. | |
| 6,211,032 B1 | 4/2001 | Redford et al. | |
| 6,261,892 B1 * | 7/2001 | Swanson | 438/238 |
| 6,284,149 B1 | 9/2001 | Li et al. | |
| 6,284,657 B1 | 9/2001 | Chooi et al. | |
| 6,387,819 B1 | 5/2002 | Yu | |
| 6,399,424 B1 | 6/2002 | Matsuura et al. | |
| 6,528,426 B1 * | 3/2003 | Olsen et al. | 438/689 |
| 6,617,244 B2 * | 9/2003 | Nishizawa | 438/637 |
| 6,743,725 B1 * | 6/2004 | Hu et al. | 438/694 |

* cited by examiner

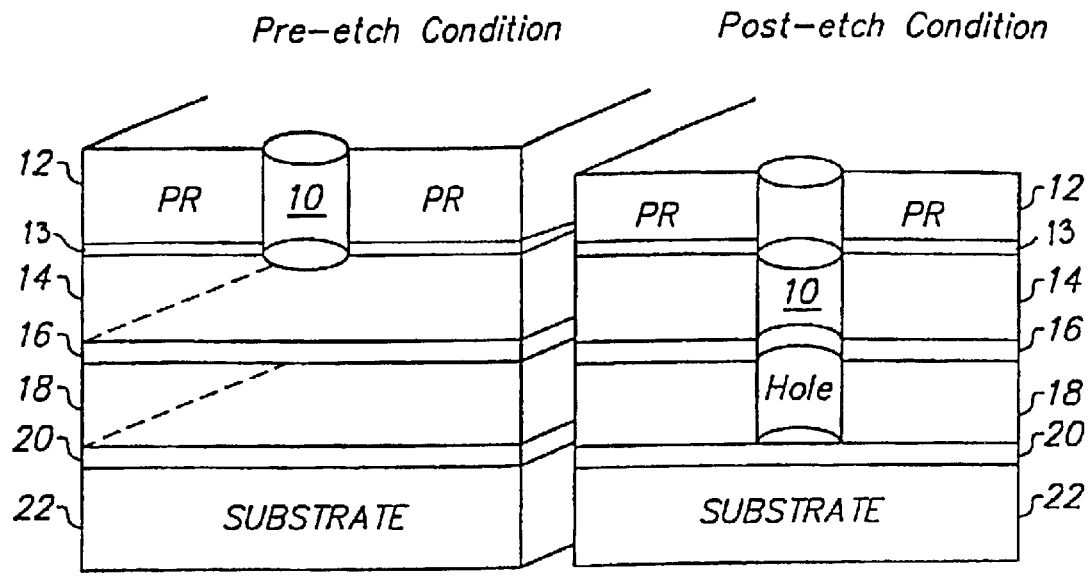
FIG. 1A      FIG. 1B
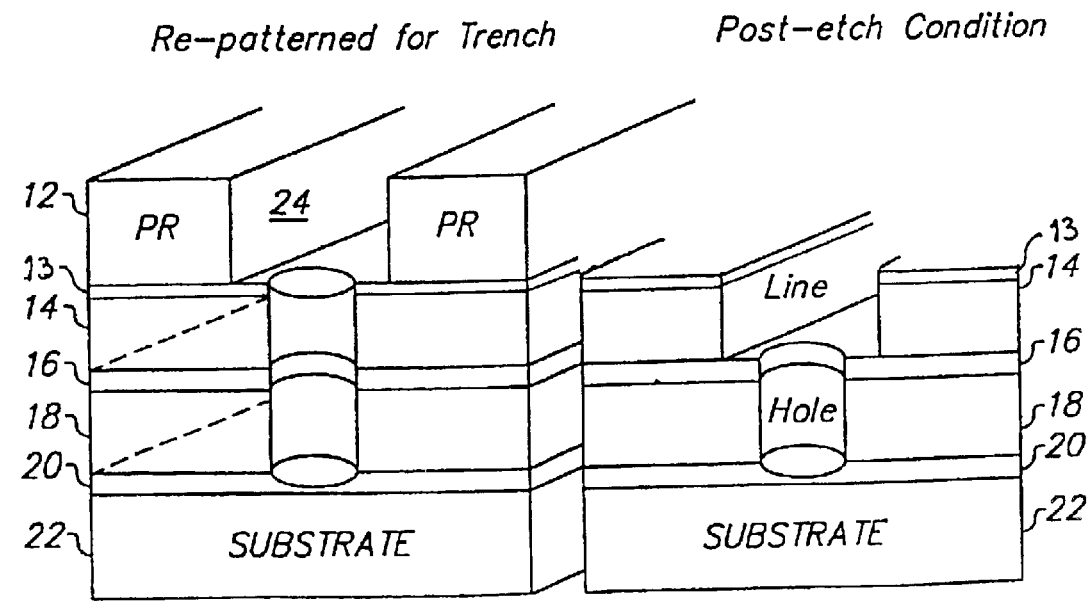
FIG. 1C      FIG. 1D

Pre-etch Condition

Post-etch Condition

METHOD FOR ETCHING SILICON CARBIDE

CROSS REFERENCE

This patent application is a continuation in part of patent application Ser. No. 09/820,696 titled "Plasma Etching of Silicon Carbide" which was filed on Mar. 30, 2001 now abandoned, which is herein incorporated by reference.

BACKGROUND OF THE INVENTION

1. Field of Invention

The present invention relates to the etching of dielectric materials. More particularly, the present invention is related to the selective etching of silicon carbide using a chlorine containing gas.

2. Description of Related Art

The manufacture of multilayer structures typically involves patterned etching of areas of the semiconductor surface that are covered by a photoresist protective material. One etching technique is reactive ion etching (RIE). This process involves positioning a semiconductor wafer in a reaction chamber and feeding etchant gases into the chamber. The etchant gases are dissociated in a radio frequency (RF) field so that ions within the etchant gases are accelerated to the wafer surface. The accelerated ions combine chemically with unmasked material on the wafer surface and a volatile etch product is produced that is incorporated into the plasma. The concentration of the volatile etch product can be tracked in order to determine the end-point of the RIE process, i.e., when the chemical reaction has removed the desired level of material from the wafer surface. During the RIE process, a single layer or multiple layers of material or film may be removed. The materials may include, for example, silicon carbide (SiC), silicon nitride ($Si_3N_4$), PSG, silicon dioxide ($SiO_2$), poly-silicon (PSi), or a low-k dielectric material.

A variety of patents teach the etching of SiC. U.S. Pat. No. 3,398,033 issued to Haga teaches wet etching of silicon carbide by the use of a mixture using oxygen (O2) and chlorine (Cl2) heated to between 1200° C. and 1300° C. U.S. Pat. No. 4,351,894 issued to Yonezawa teaches a plasma etch process for removing SiC using carbon tetrafluoride and optionally oxygen (O2). U.S. Pat. No. 4,595,453 issued to Yamazaki teaches using hydrogen fluoride gas (HF) in a dry etch plasma process. U.S. Pat. Nos. 4,865,685 and 4,981,551, both issued to Palmour, teach reactive ion etching of SiC using NF3 and, alternatively NF3 mixed with O2 and argon (Ar).

However, each of these patents fail to teach a method for selectively etching silicon carbide (SiC) at an etch rate that is higher than the etch rate for a low-k dielectric. Generally, SiC has been used as an etch stop layer or as a hardmask layer in dual damascene applications that employ low-k dielectric materials. As a result of having a SiC layer near a low-k dielectric materials, there has been a need for selectively etching the SiC at a faster rate than the low-k dielectric material.

SUMMARY OF INVENTION

The present invention provides a method for achieving a silicon carbide to low-k dielectric etch selectivity ratio of greater than 1:1 using a chlorine containing gas and either hydrogen ($H_2$) gas or nitrogen ($N_2$) gas. The method is applied to a semiconductor substrate having a low-k dielectric layer and a silicon carbide layer. The chlorine containing gas is a gas mixture that includes either HCl, $BCl_3$, $Cl_2$, or any combination thereof. In one embodiment, the method provides for supplying an etchant gas comprising a chlorine containing gas and a hydrogen ($H_2$) gas. The etchant gas is then energized to generate a plasma which then etches openings in the silicon carbide at a faster etch rate than the low-k dielectric etch rate. In an alternative embodiment, the etchant gas mixture comprises a chlorine containing gas and a nitrogen ($N_2$) gas.

BRIEF DESCRIPTION OF THE DRAWINGS

Preferred embodiments of the present invention are shown in the accompanying drawings wherein:

FIGS. 1A–D shows schematic representations of a via-first dual-damascene structure which can be etched according to the process of the invention. FIG. 1A shows a pre-etch condition. FIG. 1B shows a post-etch condition in which a via has been etched. FIG. 1C shows the structure re-patterned for a trench etch. FIG. 1S shows a post-etch condition in which the trench has been etched.

FIG. 2A shows a pre-etch condition. FIG. 2B shows a post-etch condition in which a trench has been etched. FIG. 2C shows the structure re-patterned for a via etch. FIG. 2D shows a post-etch condition in which the via has been etched.

FIG. 3a shows a pre-etch condition. FIG. 3B shows a post-etch condition in which and a via have been etched.

DETAILED DESCRIPTION

Figures 2A, 2B:
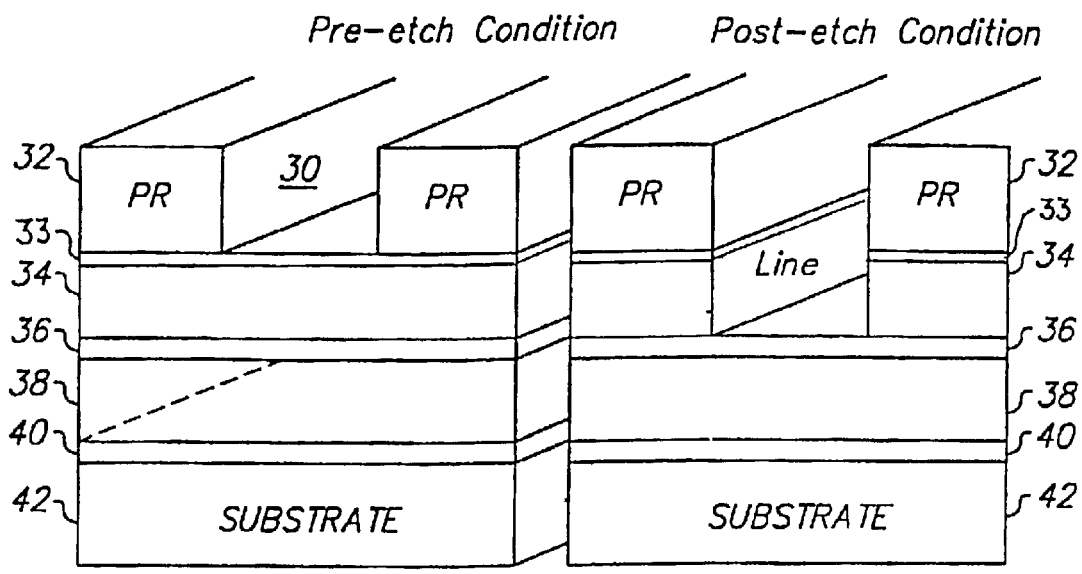
FIGS. 2A–D show schematic representations of a trench-first dual-damascene structure which can be etched according to the process of the invention.

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

The invention provides a process for plasma etching silicon carbide (SiC) with selectivity to an overlapping an/or underlying dielectric layer of material. The dielectric material can comprise various low-k dielectric materials, including organic low-k materials, inorganic dielectric materials, silicon dioxide, silicon oxynitride, or the like. In order to achieve a desired selectivity to such dielectric materials, the plasma etch gas chemistry is selected to achieve a desired etch rate of the silicon carbide while etching the dielectric material at a slower rate.

Silicon carbide has favorable characteristics as a semiconductor material, including its wide bandgap, high thermal conductivity, high saturated electron drift velocity and high electron mobility. These characteristics make SiC an attractive dielectric material for integrated circuits. Additionally, SiC has found application as etch stops, protective coatings, masks, diffusion barriers, and the like due to its relative resistance to certain types of etchants utilized in multilayer integrated circuit manufacturing. However, there are certain difficulties working with silicon carbide, including high process temperatures, impurity of starting materials, difficulty with certain doping techniques, and limited development of suitable etching techniques with high selectivity ratios.

The invention provides a semiconductor manufacturing process wherein openings can be plasma etched in silicon carbide layers while providing desired selectivity to underlying and/or overlying low-k dielectric layers. Low-k dielectrics can be categorized as follows: doped oxide, organic, highly fluorinated, and porous materials. Low-k materials can be deposited either by spin-on or CVD methods. Porous materials typically use spin-on methods, with controlled evaporation of the solvent providing the desired pore structure. A Table of typical low-k dielectrics is provided below.

TABLE 1

Illustrative Low-k Dielectric Materials

| Film Types | Sub-Type | Examples | k range |
|---|---|---|---|
| Doped Oxide | F-doped | FSG | 3.5 |
| | H-doped | HSQ | 2.7–3.5 |
| | C (and H) doped | OSG, MSQ, CVD low-k | 2.6–2.8 |
| Organic | | BCB, SiLK, FLARE, PAE-2 | 2.6–2.8 |
| Highly Fluorinated | | Parylene AF4, a-CF, PTFE | 2.0–2.5 |
| Porous | | Aerogels, Xerogels, Nanogels | <2.2 |

Low-k dielectric materials have dielectric constants of less than 4.0, and generally the dielectric constants are less than 3.0.

According to the invention, in the manufacture of a single or dual-damascene structuring wherein a low-k dielectric layer is etched with 0.25 $\mu$m or smaller geometry to an etch depth of at least 1.8 $\mu$m, a silicon carbide layer is etched with a silicon carbide to low-k dielectric etch rate selectivity of greater than 1:1. Thus, the SiC etch rate is greater than the low-k dielectric etch rate. By way of example and not of limitation, the structures can include a hard mask having a thickness of approximately 40 to 60 nm; low-k dielectric layers having a thickness of approximately 200 to 400 nm; etch stop layers having a thickness of approximately 40 to 60 nm; barrier layers having a thickness of around 40 to 60 nm, metallization layers, metallization filled vias and trenches and the like. In the following description, silicon carbide may be used for one or more layers of various damascene structures. However, the process of the invention is applicable to any integrated circuit structure wherein silicon carbide is used an etched component of the structure.

FIGS. 1A–D show schematics of how a silicon carbide layer can be etched during a via first dual damascene etch process. FIG. 1A shows a pre-etch condition wherein an opening 10 corresponding to a via is provided in a photoresist 12 which overlies a stack of layers including a mask 13 of silicon carbide, a first low-k dielectric 14, a first stop layer 16 of silicon carbide, a second low-k dielectric layer 18, a second stop layer 20 of silicon carbide and a substrate 22 such as a silicon wafer which may include an electrically conductive layer (not shown) and other layers such as barrier layers (not shown) beneath the etch stop layer 20. FIG. 1B shows the structure after etching wherein the opening 10 extends through the mask 13, the low-k dielectric layers 14, 18 and the first stop layer 16 to the second stop layer 20. FIG. 1C shows the structure after re-patterning the masking layer for a trench 24. FIG. 1D shows the structure after stripping of the photoresist and etching wherein the first low-k dielectric layer 14 is etched down to the first stop layer 16. The opening 10, also referred to as a "hole", in FIG. 1D is shown to extend to the second etch stop layer 20. It shall be appreciate by those skilled in the art having the benefit of this disclosure, that the post etch condition displayed in FIG. 1D may include extending the opening 10 through the second etch stop layer 20 to the substrate 22.

Figures 2C, 2D:
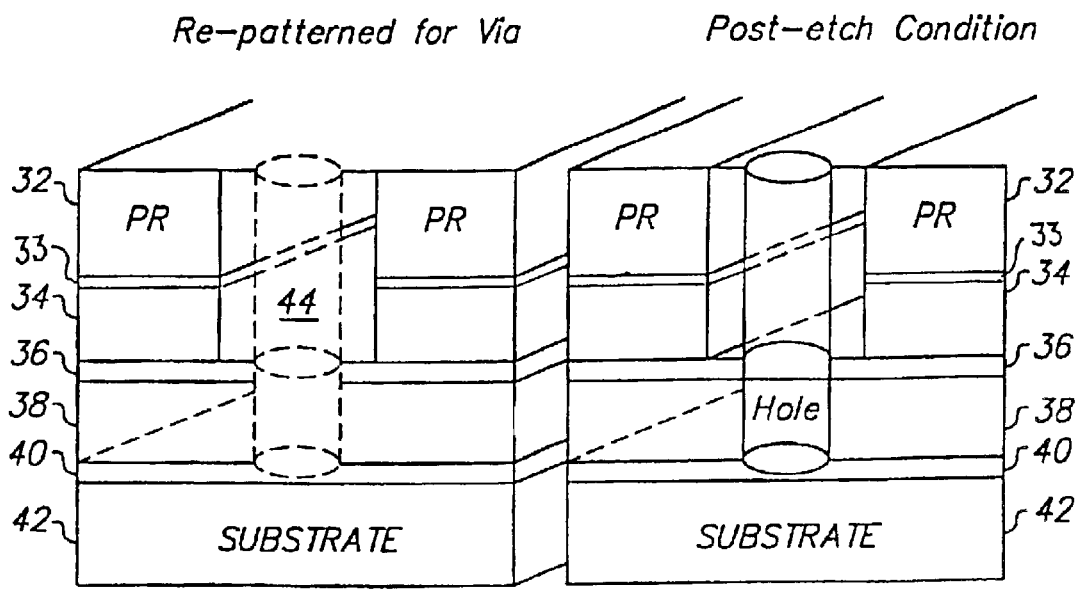

FIGS. 2 A–D shows schematics of how a silicon carbide layer can be etched during a trench-first dual-damascene etch process. FIG. 2A shows a pre-etch condition wherein an opening 30 corresponding to a trench is provided in photoresist masking layer 32 which overlies a stack of layers including a mask layer 33, a first low-k dielectric layer 34, a first stop layer 36 of silicon carbide, a second low-k dielectric layer 38, a second stop layer 40 of silicon carbide, and a substrate 42 such as silicon wafer which may further include metallization and barrier layers (not shown) beneath the stop layer 40. FIG. 2B shows the structure after etching wherein the opening 30 extends through the low-k dielectric layer 34 to the first stop layer 36. FIG. 2C shows the structure after repatterning for a via 44. FIG. 2D shows the structure after etching wherein the second low-k dielectric layer 38 is etched down to the second stop layer 40. The opening 30 in FIG. 2D is shown to extend to the second etch stop layer 40. It shall be appreciated by those skilled in the art having the benefit of this disclosure, that the post etch conditon displayed in FIG. 2D may include extending the opening 30 through the second etch stop layer 40 to the substrate 42.

Figure 3A:
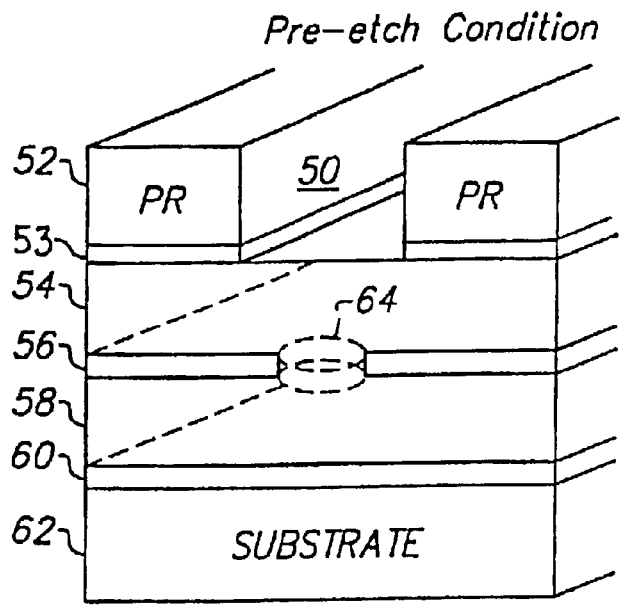
FIGS. 3A–B shows schematic representations of a self-aligned dual-damascene structure which can be etched according to the process of the invention.
Figure 3B:
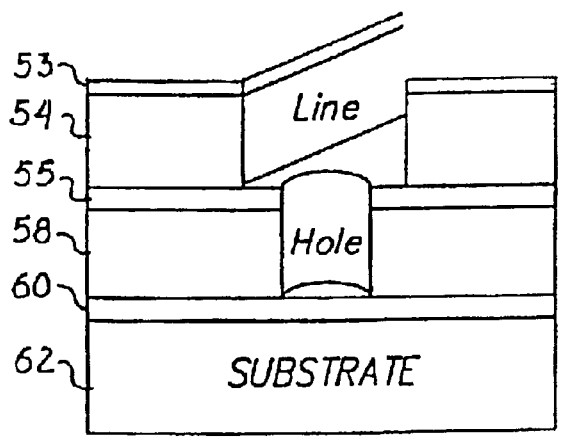

FIGS. 3A–B shows schematics of how a silicon carbide layer can be etched during a single step dual-damascene etch process. FIG. 3A shows a pre-etch condition wherein an opening 50 corresponding to a trench is provided in a photoresist 52 and a masking layer 53 which overlies a stack of layers including a first low-k dielectric layer 54, a first stop layer 56 of silicon carbide, a second low-k dielectric layer 58, a second stop layer 60 of silicon carbide, and a substrate 62 such as a silicon wafer which can include metallization and barrier layers (not shown) beneath the stop layer 60. In order to obtain etching of vias through the first stop layer 56 in a single etching step, first stop layer 56 includes an opening 64. FIG. 3B shows the structure after etching wherein the opening 50 extends through the low-k dielectric layer 54 to the first stop layer 56 and the opening 64 extends through the second low-k dielectric 58 to the second stop layer 60. The hole in FIG. 3B is shown to extend to the second etch stop layer 60. It shall be appreciated by those skilled in the art having the benefit of this disclosure that the post etch condition displayed in FIG. 3B may include extending the opening 60 through the second etch stop layer 60 to the substrate 62. Such an arrangement can be referred to as a "self-aligned dual-damascene" structure.

The process of the invention is applicable to etching of silicon carbide layers in damascene or other integrated circuit structures including etching of silicon carbide layers in the form of substrates. The process of the invention is applied in manufacturing multilayer structures which includes various low-k dielectric materials. The low-k dielectrics include but are not limited to doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), c-doped silica glass such CORAL (a product available from Novellus Systems, Inc.), or other suitable dielectric material having a dielectric constant below 4.0, and generally below 3.0. Such low-k dielectric layers can overlie an intermediate layer such as a barrier layer and a conductive or semiconductive layers such as polycrystalline silicon, metals such as aluminum, copper, titanium, tungsten, molybdenum or alloys thereof, nitrides such as titanium nitride, metal suicides such titanium silicide, cobalt silicide, tungsten silicide, molybdenum silicide, etc.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called inductively coupled plasma reactor, an electron-cyclotron resonance (ECR) plasma reactor, a helicon plasma reactor, or the like. An illustrative plasma may be produced in a parallel plate etch reactor such as the dual frequency plasma etch reactor described in commonly owned U.S. Pat. No. 6,090,304, the disclosure of which is hereby incorporated by reference.

Figure 4:
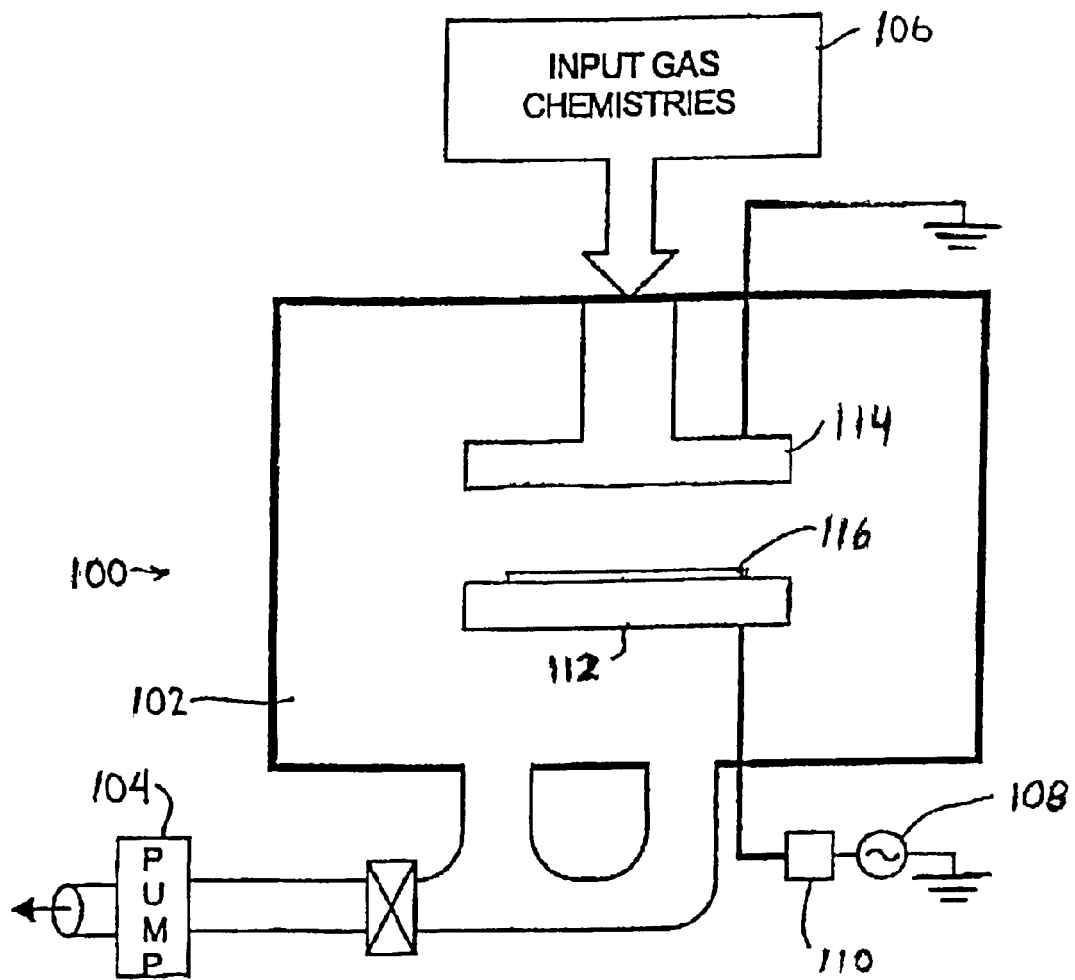
FIG. 4 shows a schematic representation of a medium density parallel plate plasma reactor which can be used to carry out the process of the invention.

The process of the invention may be carried out in a parallel plate plasma reactor such as reactor 100 shown in FIG. 4. The reactor 100 includes a chamber having an interior 102 maintained at a desired vacuum pressure by a vacuum pump 104 connected to an outlet in a wall of the reactor. Etching gas can be supplied to the plasma reactor supplying gas from gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched with plasma generated by energizing the etch gasses into a plasma state. Other capacitively coupled reactors can also be used such as reactors wherein RF power is supplied to both electrodes.

Each of the etching gas mixtures described below provide for the selective etching of a silicon carbide (SiC) layer at a faster rate than the etching of a low-k dielectric layer, thereby providing improved SiC to low-k dielectric etch selectivity. The illustrative low-k dielectric is referred to as CORAL which is a trademarked product of Novellus Systems, Inc. of San Jose, Calif. CORAL is an organo-silicate glass (OSG) film having the chemical formula SiOCH. For purposes of this patent application the terms CORAL and organo-silicate glass will be used interchangeably. Typically, CORAL has a dielectric constant of 2.85 and a refractive index of 1.39. Additionally, the density of CORAL is low, i.e. 1.34 g/cm$^3$, compared to SiO$_2$, i.e. 1.72 g/cm$^3$, due to the —CH$_3$ (methyl) substitution for oxygen in the Si—O—Si linkages.

A first etching gas mixture embodiment having a high silicon carbide (SiC) to low-k dielectric selectivity comprises hydrogen and a chlorine containing gas mixture. The chlorine containing gas mixture includes either HCl, BCl$_3$, Cl$_2$ or any combination thereof. Typically, the hydrogen is gaseous H$_2$ and the chlorine containing gas mixture is Cl$_2$. For 200 mm applications, the chemical constituents are supplied to the chamber at flow rates of 10 to 100 sccm for the chlorine (Cl$_2$) containing gas, flow rates of 50 to 550 sccm for the hydrogen (H$_2$) gas, and flow rates of 0 to 100 sccm for an inert carrier gas such as Argon. Alternatively, other inert gases that may be used which include noble gases such as He, Ne, Kr, and Xe.

Table 2 provides an even more detailed illustrative example of the operating parameters for an illustrative etch process using hydrogen and chlorine. In each of the illustrative examples provided below the SiC layer is below the illustrative low-k dielectric, i.e. CORAL, layer. The etchant gas chemistry for Table 2 includes a chlorine containing gas, Cl$_2$, having a flow rate of 100 sccm and a hydrogen, H$_2$, gas flow rate of 100 sccm. Additionally, in the illustrative example in Table 2 there is no Argon being fed to the chamber. Other operating parameter in Table 2 include a chamber pressure of 70 Mtorr, and an RF power of 300 watts at 27 MHz applied to the powered electrode 112.

TABLE 2

Exemplary Gas Mixture: H$_2$ and Cl$_2$

| Etchant Gas Component | Supply Rate (sccm) | Chamber Pressure (Mtorr) | RF Power (W) | SiC Etch Rate (Å/min) | CORAL Etch Rate (Å/min) |
|---|---|---|---|---|---|
| Cl$_2$ | 100 | 70 | 300 | 2413 | 780 |
| H$_2$ | 100 | | | | |
| Ar | 0 | | | | |

Using RF power of 300 watts at 27 MHz for the powered electrode the etch rate for the silicon carbide was 2413 Å/min and the etch rate for the CORAL dielectric was 780 Å/min. The selectivity ratio for silicon carbide to CORAL in the illustrative example of Table 2 is 3.1:1.

In Table 3 an alternative embodiment is shown in which the hydrogen gas is applied at a flow rate of 50 sccm. Additionally, Argon gas is applied at 50 sccm. The chlorine is supplied at the same flow rate as in Table 2, namely, 100 sccm. The chamber pressure and the applied RF power also remains the same.

TABLE 3

Exemplary Gas Mixture: H$_2$, Cl$_2$ and Ar

| Etchant Gas Component | Supply Rate (sccm) | Chamber Pressure (Mtorr) | RF Power (W) | SiC Etch Rate (Å/min) | CORAL Etch Rate (Å/min) |
|---|---|---|---|---|---|
| Cl$_2$ | 100 | 70 | 300 | 2316 | 1045 |
| H$_2$ | 50 | | | | |
| Ar | 50 | | | | |

In Table 4 yet another embodiment is shown in which the hydrogen gas is applied at a flow rate of 250 sccm. Argon gas is not applied. The chlorine is supplied at the same flow rate as in Table 2 and Table 3. The chamber pressure remains and the applied RF power also remains the same as in Table 2 and Table 3.

TABLE 4

Exemplary Gas Mixture: H$_2$ and Cl$_2$

| Etchant Gas Component | Supply Rate (sccm) | Chamber Pressure (Mtorr) | RF Power (W) | SiC Etch Rate (Å/min) | CORAL Etch Rate (Å/min) |
|---|---|---|---|---|---|
| Cl$_2$ | 100 | 70 | 300 | 2248 | 1062 |
| H$_2$ | 250 | | | | |
| Ar | 0 | | | | |

The resulting silicon carbide etch rate is 2248 Å/min and the CORAL etch rate is 1062 Å/min. The resulting silicon carbide to CORAL selectivity ratio is 2.1:1.

Table 5 reflects another embodiment in which the RF power is increased to 400 watts. The other operating parameters include a chlorine flow rate of 100 sccm, a hydrogen flow rate of 100 sccm, and a chamber pressure of 70 Mtorr.

TABLE 5

Exemplary Gas Mixture: $H_2$ and $Cl_2$

| Etchant Gas Component | Supply Rate (sccm) | Chamber Pressure (Mtorr) | RF Power (W) | SiC Etch Rate (Å/min) | CORAL Etch Rate (Å/min) |
|---|---|---|---|---|---|
| $Cl_2$ | 100 | 70 | 400 | 3265 | 1325 |
| $H_2$ | 100 | | | | |
| Ar | 0 | | | | |

The resulting etch rate for the silicon carbide and CORAL is 3265 Å/min and 1325 Å/min, respectively. The selectivity ratio of silicon carbide to CORAL is 2.5:1.

Referring to Table 6 there is shown still another alternative embodiment in which the chamber pressure is increased to 200 Mtorr. The flow rate for the chlorine and hydrogen gas are both 100 sccm. The applied RF power is 300 Watts at 27 MHz.

TABLE 6

Exemplary Gas Mixture: $H_2$ and $Cl_2$

| Etchant Gas Component | Supply Rate (sccm) | Chamber Pressure (Mtorr) | RF Power (W) | SiC Etch Rate (Å/min) | CORAL Etch Rate (Å/min) |
|---|---|---|---|---|---|
| $Cl_2$ | 100 | 200 | 300 | 2213 | 754 |
| $H_2$ | 100 | | | | |
| Ar | 0 | | | | |

The resulting silicon carbide etch rate is 2213 Å/min and CORAL etch rate is 754 Å/min. The silicon carbide to CORAL selectivity ration is 2.9.

The high silicon carbide to CORAL selectivity ratios can also be obtained for other low-k dielectrics which include polyimides, organic siloxane polymers, poly-arylene ethers, carbon-doped silicate glass or silsesquioxane glass, spin-on glass, fluorinated or non-fluorinated silicate glass, diamond-like amorphous carbon, aromatic hydrocarbon polymer such as "SiLK" (a trademark of Dow Chemical Co.), or any similar low dielectric constant (low-k) material known in the art to be useful as a low-k dielectric material.

It shall be appreciated by those skilled in the art that the optimal flow rates and ratios for the illustrative gas mixture of Table 2 through Table 6 may change depending on the type of plasma etch chamber, the substrate size, and other such variables that are well known to those skilled in the art. Furthermore, it shall also be appreciated by those of ordinary skill in the art that the selection of temperatures, power level, and gas pressures used in practicing the present invention can vary widely and that those specified herein are give by way of example, and not as a limitation for the scope of the invention.

A second etchant gas mixture in which the SiC etch rate is greater than the low-k dielectric etch rate a nitrogen gas and a chlorine containing gas. The chlorine containing gas mixture includes either HCl, $BCl_3$, $Cl_2$ or any combination thereof. Typically, the nitrogen is gaseous $N_2$ and the chlorine containing gas mixture is $Cl_2$.

Typically, the chemical constituents are supplied to the chamber at flow rate of 10 to 100 sccm for the chlorine ($Cl_2$) containing gas, flow rates of 50 to 550 sccm for the nitrogen ($N_2$) gas, and flow rates of 0 to 100 sccm for an inert carrier gas such as Argon. As previously described, other inert carrier gases include noble gases such as He, Ne, Kr, and Xe.

A more detailed illustrative example of the operating parameters for an illustrative etch process using the second gas mixture is set forth in Table 7. The etchant gas chemistry for Table 7 includes a chlorine containing gas, $Cl_2$, having a flow rate of 100 sccm and a nitrogen, $N_2$, gas flow rate of 50 sccm. Additionally Table 3 includes an illustrative carrier gas, Argon, as part of the etchant gas chemistry being fed at a flow rate of 50 sccm. Other operating parameters described in Table 7 include a chamber pressure of 70 Mtorr, and an RF power of 300 watts at 27 MHz.

TABLE 7

Exemplary Gas Mixture: $N_2$, $Cl_2$ and Ar

| Etchant Gas Component | Supply Rate (sccm) | Chamber Pressure (Mtorr) | Top RF Power (W) | SiC Etch Rate (Å/min) | CORAL Etch Rate (Å/min) |
|---|---|---|---|---|---|
| $Cl_2$ | 100 | 70 | 300 | 1568 | 1000 |
| $N_2$ | 50 | | | | |
| Ar | 50 | | | | |

The resulting etch rate for the silicon carbide in Table 7 is 1568 Å/min and the CORAL etch rate is 1000 Å/min. The resulting selectivity ratio of silicon carbide to CORAL is 1.6:1.

For the nitrogen and chlorine gas mixtures the high silicon carbide to CORAL selectivity ratio can also be obtained for other low-k dielectric materials. Again the reference to CORAL is used simply as an illustrative example. Additionally, as described above the optimal flow rates and ratios for the illustrative gas mixture of Table 7 may change depending on the type of plasma etch chamber, the substrate size, temperature, power level, gas pressure and other such variables that are well known to those skilled in the art.

Although the description above contains many specifications, these should not be construed as limiting the scope of the invention but as merely providing illustrations of some of the presently preferred embodiments of this invention. Thus, the scope of the invention should be determined by the appended claims and their legal equivalents rather than by the illustrative examples given.

What is claimed is:

1. A method of improving silicon carbide to dielectric etch selectivity while plasma etching a layer of silicon carbide comprising:

positioning a semiconductor substrate in a reactor chamber, said semiconductor substrate including a first layer of silicon carbide and a second layer of a low-k dielectric material disposed above said first layer of silicon carbide;

supplying an etchant gas to the chamber, said etchant gas comprising a chlorine containing gas, and a hydrogen ($H_2$) gas;

energizing the etchant gas into a plasma; and etching openings in said first silicon carbide layer through openings in said second low-k dielectric layer using said plasma, said etching said openings in said silicon carbide layer happens at a faster rate than an etch rate for said second low-k dielectric layer.

2. The method of claim 1 wherein said etchant gas further comprises a carrier gas which is a noble gas wherein said noble gas is selected from a group consisting of He, Ne, Ar, Kr and Xe.

3. The method of claim 1 wherein said chlorine containing gas is selected from a group consisting of HCl, $BCl_3$, and $Cl_2$.

4. The method of claim 3 wherein said silicon carbide to said low-k dielectric etch rate selectivity ratio is greater than 1:1.

5. The method of claim 3 wherein said silicon carbide to said low-k dielectric etch rate selectivity ratio is greater than 1.5:1.

6. The method of claim 3 wherein said silicon carbide to said low-k dielectric etch rate selectivity ratio is greater than 2:1.

7. The method of claim 3 wherein said chlorine containing gas and said hydrogen gas are supplied to the reactor chamber at a flow rate ratio of at least 1:1.

8. The method of claim 3 wherein said chlorine containing gas and said hydrogen gas are supplied to the reactor chamber at a flow rate ratio of at least 2:1.

9. The method of claim 3 further comprising applying a minimum pressure of 15 Mtorr to said chamber.

10. The method of claim 3 further comprising an electrode configured to communicate at least 300 Watts of RF power to said etchant gas.

11. The method of claim 3 wherein said low-k dielectric is an organo-silicate glass.

12. The method of claim 3 wherein said etchant gas further comprises a carrier gas which is a noble gas wherein said noble gas is selected from a group consisting of He, Ne, Ar, Kr and Xe.

13. A method of improving silicon carbide to dielectric etch selectivity while plasma etching a layer of silicon carbide comprising:

positioning a semiconductor substrate in a reactor chamber, said semiconductor substrate including a first layer of silicon carbide and a second layer of a low-k dielectric material disposed above said first layer of silicon carbide;

supplying an etchant gas to the chamber, said etchant gas comprising $Cl_2$ gas, and a hydrogen ($H_2$) gas;

energizing the etchant gas into a plasma; and etching openings in said first silicon carbide layer through openings in said second low-k dielectric layer using said plasma, said etching said openings in said silicon carbide layer happens at a faster rate than an etch rate for said second low-k dielectric material.

14. The method of claim 13 wherein said etchant gas further comprises a carrier gas which is a noble gas wherein said noble gas is selected from a group consisting of He, Ne, Ar, Kr and Xe.

15. The method of claim 13 wherein said silicon carbide to said low-k dielectric etch rate selectivity ratio is greater than 1:1.

16. The method of claim 13 wherein said silicon carbide to said low-k dielectric etch rate selectivity ratio is greater than 1.5:1.

17. The method of claim 13 further comprising applying a minimum pressure of 0.15 Mtorr to said chamber.

18. The method of claim 13 further comprising an electrode configured to communicate at least 300 Watts of RF power to said etchant gas.

19. The method of claim 13 wherein said low-k dielectric is organo-silicate glass.

* * * * *